United States Patent
Gray et al.

(10) Patent No.: US 6,435,354 B1
(45) Date of Patent: Aug. 20, 2002

(54) CABLE MANAGEMENT ARM ASSEMBLY

(75) Inventors: Randolph D. Gray; Tiffany J. Williams, both of Austin, TX (US)

(73) Assignee: Dell Products L.P., Round Rock, TX (US)

(*) Notice: Subject to any disclaimer, the term of this patent is extended or adjusted under 35 U.S.C. 154(b) by 10 days.

(21) Appl. No.: 09/633,449

(22) Filed: Aug. 7, 2000

(51) Int. Cl.$^7$ .................................................. A47F 7/00
(52) U.S. Cl. ........................................................ 211/26
(58) Field of Search .............................. 211/26, 80, 81, 211/85, 96, 104, 116, 119.004, 132.1, 168; 361/826, 829

(56) References Cited

U.S. PATENT DOCUMENTS

| | | | |
|---|---|---|---|
| 5,018,052 A | 5/1991 | Ammon et al. | 361/428 |
| 5,216,579 A | 6/1993 | Basara et al. | 361/383 |
| 5,571,256 A | 11/1996 | Good et al. | 211/26 |
| 5,655,738 A | 8/1997 | Ragsdale et al. | 248/68.1 |
| 5,890,602 A | * 4/1999 | Schmitt | 211/26 |
| 5,893,593 A | 4/1999 | Dowling | 292/336.3 |
| 5,921,402 A | 7/1999 | Magenheimer | 211/26 |
| 6,070,742 A | * 6/2000 | McAnally et al. | 211/26 |
| 6,230,903 B1 | * 5/2001 | Abbott | 361/829 |

* cited by examiner

Primary Examiner—Alvin Chin-Shue
Assistant Examiner—Sarah Purol
(74) Attorney, Agent, or Firm—Baker Botts L.L.P.

(57) ABSTRACT

In present disclosure, a system and method are described for managing cables within a rack. In one aspect, a computer rack system for disposing one or more computers is disclosed that includes a rack that has a standard interface and a cable management assembly. The cable management assembly acts to secure cables connecting computer components housed within the rack system. The cable management assembly includes a rack connector, a first dual hinge assembly, a first arm, a second arm, and a component connector. The rack connector is formed to releaseably connect to the standard interface of the rack and the first dual hinge assembly is connected to the rack connector.

20 Claims, 5 Drawing Sheets

CABLE MANAGEMENT ARM ASSEMBLY

TECHNICAL FIELD

The present disclosure relates in general to the field of electronics and to the storage and management of computer equipment. More particularly, the present disclosure is related to a cable management arm assembly and method of cable management.

BACKGROUND

Electronic devices such as computer components can be stored in an electronics rack system, sometimes referred to as a rack system or rack, to conserve floor space. A variety of different computer components including servers, computers, storage devices such as disk drives, tape drives, and RAID drives, as well as other electrical devices can be housed in rack systems. Standards such as the Electronics Industry Association (EIA) RS-310 19" rack standard have been developed to standardize the height and width of electronics racks to facilitate effective use of the space within rack systems.

The vertical space within a rack system is generally defined in vertical mounting unit increments, often referred to as "U's". A mounting unit or U is typically 1.75 inches. Interior rails of rack systems often have three mounting slots within each U of vertical space for attaching components. Rack systems and components are typically sized in mounting unit increments. For example, "2U" components are sized to fit within a 2U vertical space. "48U" and "72U" racks are sized to have 48U and 72U, respectively, of usable vertical space.

Access to components is often provided by a slideable structure attached to the interior rails of the rack system. These structures allow the associated components to slide forward for maintenance, repair, or installation. Also, the back of many rack system are often accessible by opening a panel or door on the back of the rack to gain access to the back or rear of components stored within a rack system.

Components stored within a rack system typically have a number of cables protruding from the rear of the components. In addition to power cables, components often have multiple input and output cables connecting one component to other components or systems housed within the rack or elsewhere. As components are installed within a rack system, cabling in the rear of the rack often becomes unmanageable. Also, to allow components to slide forward while maintaining desired electrical and signal connections, excess lengths of cable are typically provided behind each component. The excess lengths of cable contribute to cable management problems within electronics rack systems. Cables may become twisted and tangled or may snag on other cables or on other components. These cables often impede efforts to install additional components and cabling or remove components and cabling. To alleviate this problem, cable management arms are often employed.

A cable management arm is typically a hinged assembly attached to the back of the associated component. The cables are often secured to the cable management arm. When a component slides into the rack system, the cable management assembly folds behind the associated component. When the associated component slides forward, the cable management assembly unfolds and extends as necessary to maintain the desired electrical and signal connections.

While cable management arms can alleviate some problems within rack systems, they often create a host of new problems. Often, these problems begin at installation. Cable management arms are frequently attached to the interior frame of the associated rack by a number of individual fasteners. Installing and removing these fasteners to the rear of the rack system can be difficult, frustrating, and time consuming, even for an experienced technician. This is especially the case when a number of other components and their associated cabling hinder access to the rear of the rack system.

Also, cable management assemblies often include three hinged arms. As these arms fold behind the associated component, they occupy a significant amount of space between the associated component and the rear of the rack system. This may cause two undesirable consequences, first the tri-folded cable management assembly may restrict the flow of air through the rear of the rack system, preventing various components stored within the rack system from cooling properly. Second, the compacted cable management assembly often interferes with access to the components through the back of the rack system. Specifically, when the rear panel is opened, the tri-folded management assemblies are often pushed rearward, making it difficult to properly close the rear access panel of the rack system.

SUMMARY

Therefore a need has arisen for a cable management system that provides for less complex installation.

A further need has arisen for a cable management system that allows greater air flow through the rack system.

A further need has arisen for a cable management system that facilitates access to the rear portion of a rack.

In accordance with teachings of the present disclosure, a system and method are described for managing cables within a rack system. In one aspect, a computer rack system for mounting one or more computers is disclosed that includes a rack that has a standard interface and a cable management assembly. The cable management assembly acts to secure cables connecting various components housed within the rack system. The cable management assembly includes a rack connector, a first dual hinge assembly, a first arm, a second arm, and a component connector. The rack connector may be formed to releaseably connect to a standard interface of the associated rack. The first dual hinge assembly is preferably connected to the rack connector. The first arm connects with the dual hinge assembly and the second arm rotatably connects to the first arm. A component connector is preferably rotatably connected to the second arm and is formed to connect to a computer component housed within the rack system. More specifically, the rack connector may include a keyed interface for connecting with a standard interface and a threaded hole for releaseably securing the rack connector to the standard interface with a fastener. More specifically, the first arm and the second arm may have portions removed to facilitate air flow through the rack system.

In another aspect of the present disclosure, a cable management assembly is provided with a first hinge assembly having a dual hinge connected to a rack connector and a first arm. A second arm may be rotatably connected to the first arm and a component connector rotatably connects to the second arm. More specifically, the hinge assembly includes a dual hinge assembly connecting the first arm and second arm.

In yet another aspect, a method for managing cabling within a rack is disclosed. The method may include rotatably securing a first arm and second arm with each other and pivotally securing the rack connector to the first arm. The rack connector may be releaseably engaged to a standard rack interfere within the associated rack system. The method may further include securing a component connector to a component housed within the rack and securing component cables within tabs disposed along the first arm and the second arm.

The present disclosure provides a number of important technical advantages. One such advantage is providing a rack connector with a keyed interface. The keyed interface allows a cable management assembly to be easily secured to a standard interface within an associated rack system.

Having portions removed from first arm and second arm is another important technical advantage of the present disclosure. The removed portions of first arm and second arm facilitate air flow through the rack system. Providing a cable management assembly with only two arms while allowing substantially the same amount of movement of an attached component as previous three arm cable management assemblies, is another important advantage. The two arm configurations formed in accordance with teachings of the present disclosure generally require less space in the rear of the rack system when the cable management assembly is in its folded position.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 2A:
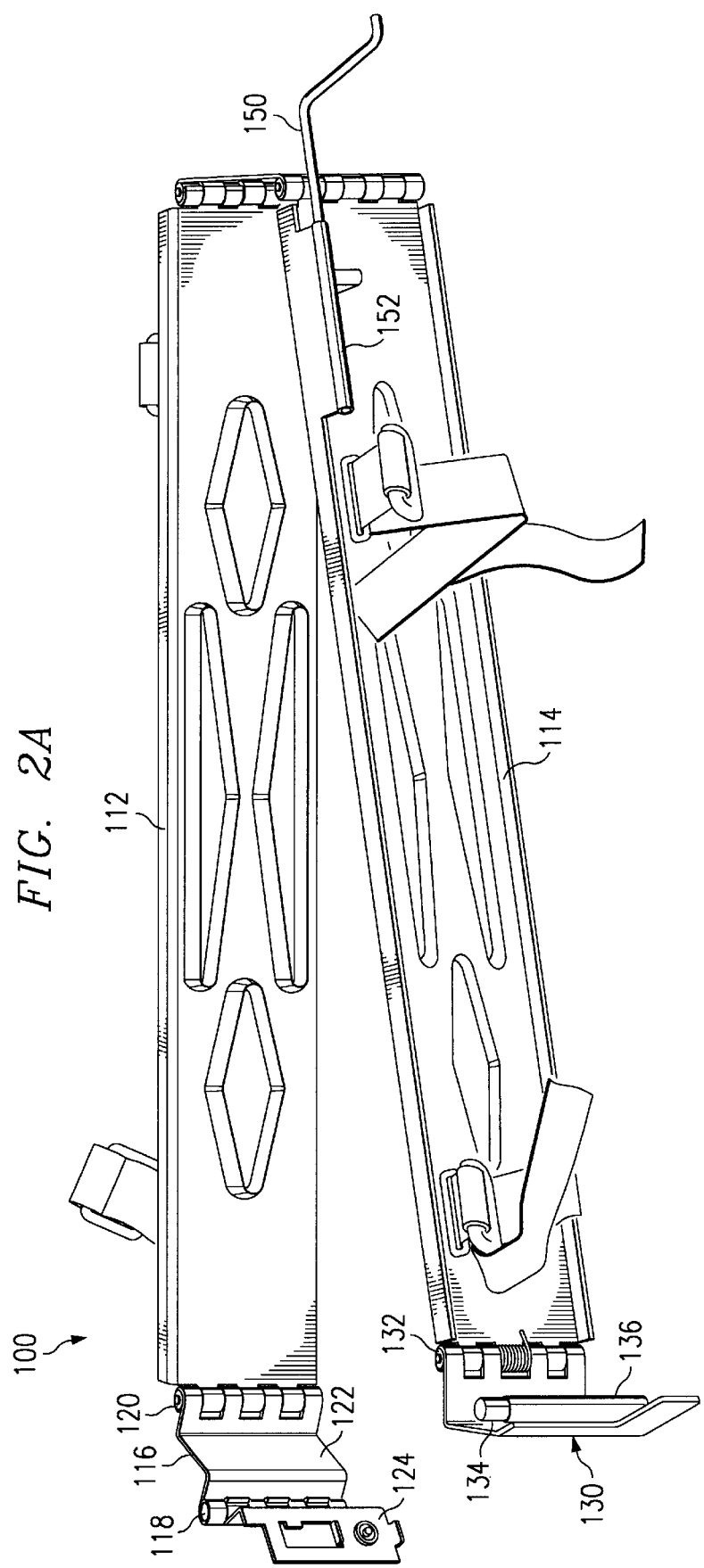
FIG. 2A is an isometric view of another embodiment of the present disclosure.
Figure 2B:
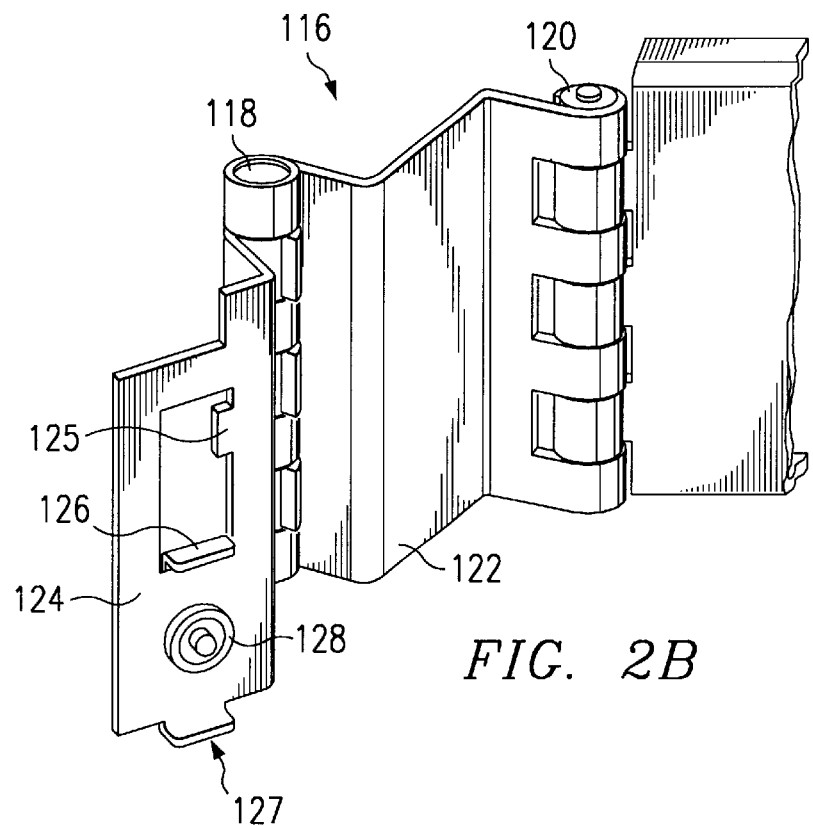
FIG. 2B is a schematic diagram with portions broken away showing a dual hinge assembly and keyed rack connector.
Figure 2C:
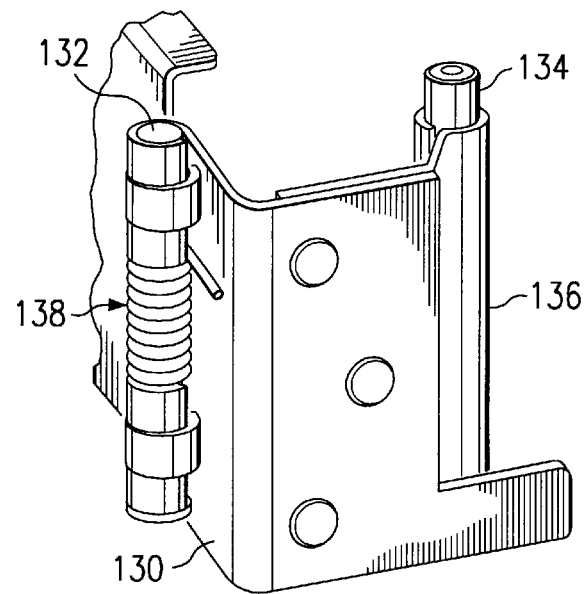
FIG. 2C is a schematic diagram with portions broken away showing a component connector.
Figure 3:
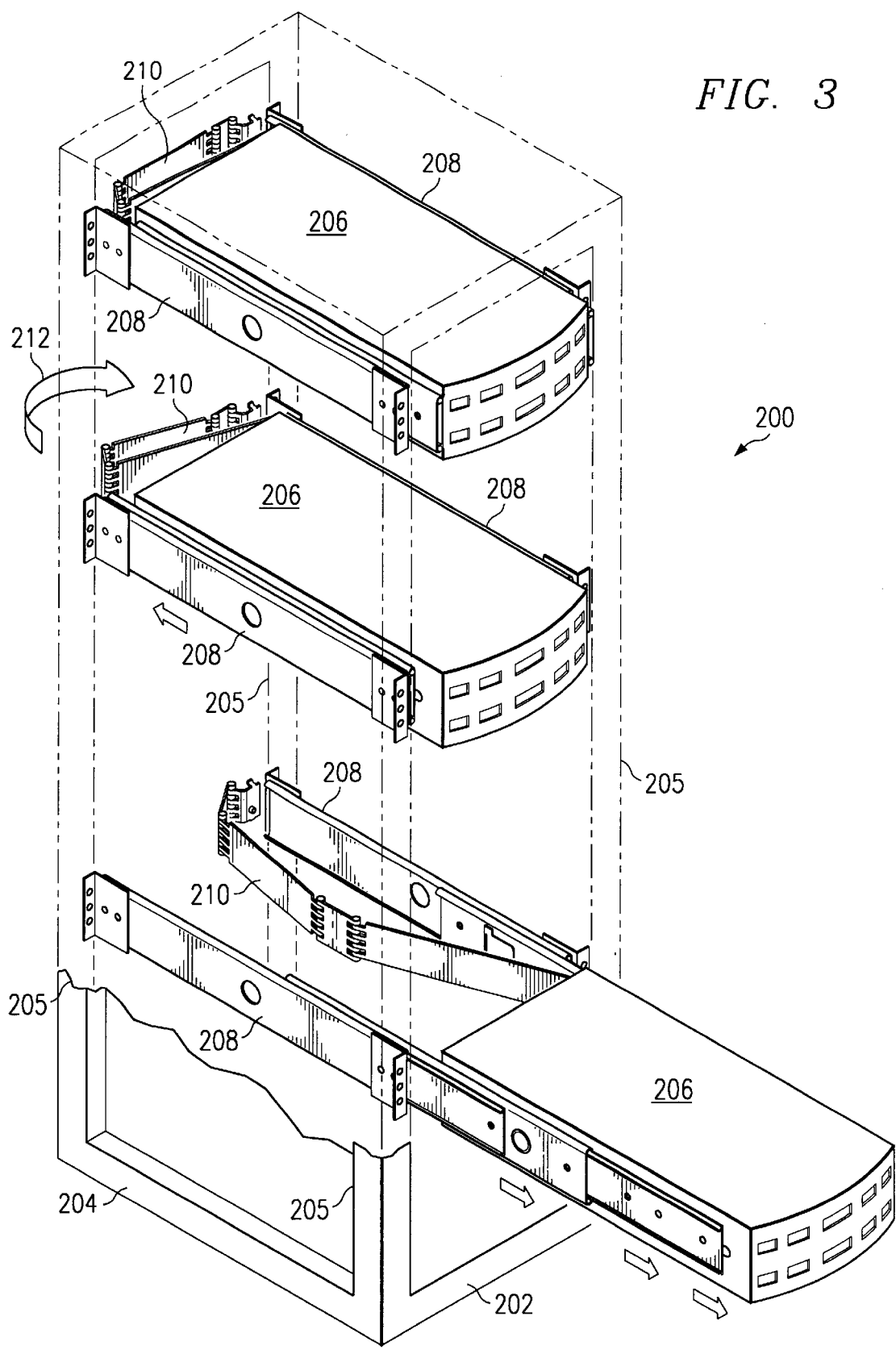
FIG. 3 is a schematic diagram of a computer system having various components mounted in a rack system using cable management assemblies in accordance with teachings of the present disclosure.

Preferred embodiments and their advantages are best understood by reference to FIGS. 1 through 3, wherein like numbers are used to indicate like and corresponding parts.

Figure 1A:
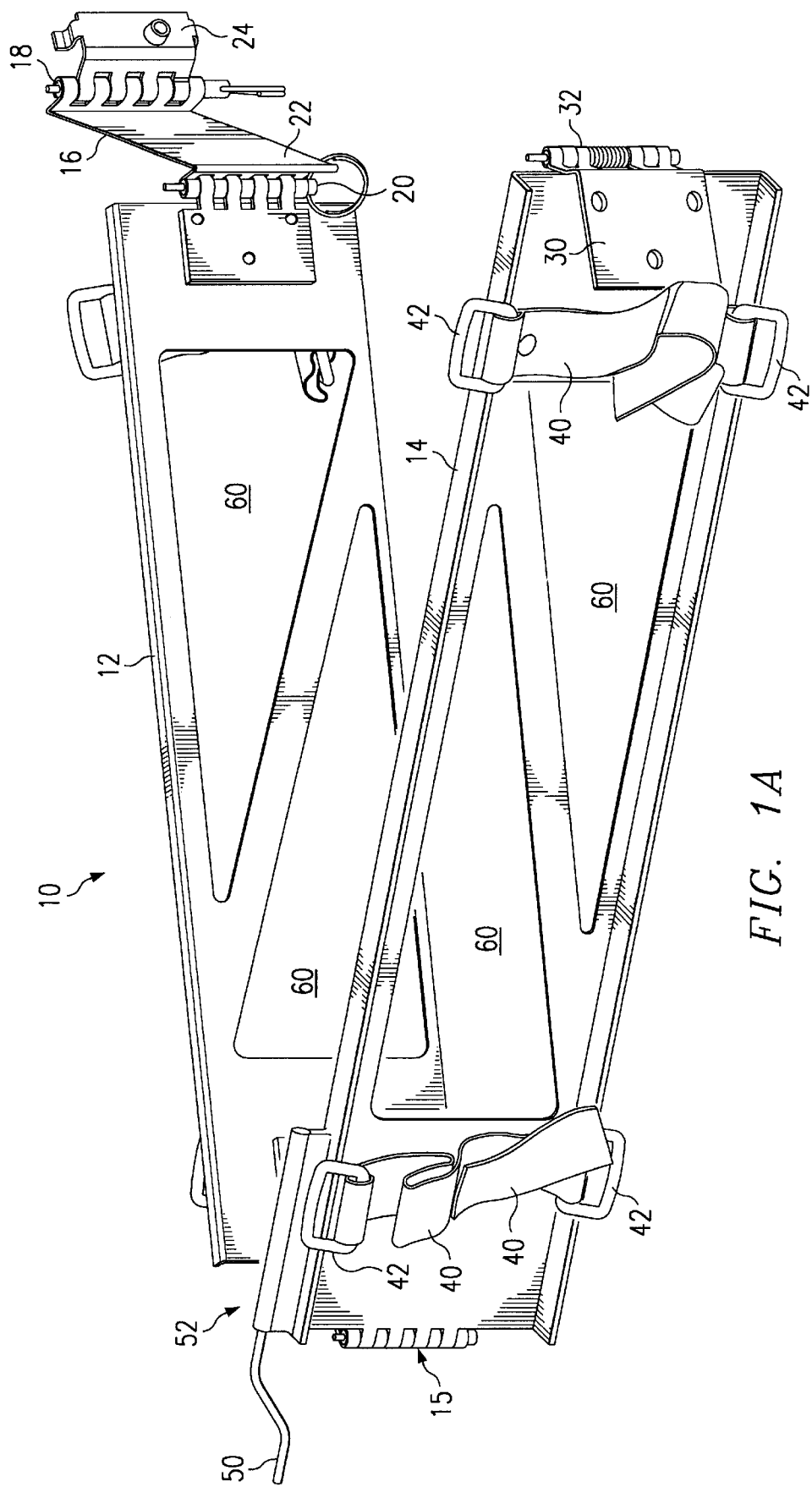
FIG. 1A is a schematic diagram showing an isometric view of one embodiment of the present disclosure.

Referring now to FIG. 1A, a schematic diagram is shown of one embodiment of a cable management assembly according to the present disclosure. Cable management assembly 10 preferably includes first arm 12, second arm 14, first hinge assembly 16, second hinge assembly 15, and component connector 30. In the present embodiment, first hinge assembly 16 is preferably a dual hinge assembly incorporating first hinge 20 and second hinge 18. Rack connector 22 is preferably rotatably or pivotally connected to second hinge 18 of dual assembly 16. Dual hinge assembly 16 preferably has a generally Z shaped configuration such that first hinge 20 is vertically offset from second hinge 18. In a preferred embodiment, the vertical offset created by the Z-shape is approximately 1U. First hinge assembly 16 is described in greater detail in FIG. 1B.

For some applications, first hinge assembly 16 may be selectively disassembled and reassembled such that the orientation and configuration of the cable management assembly 10 is reversed relative to an associated rack system (not expressly shown). Reversal of the first hinge assembly 16 preferably includes reassembling first hinge assembly 16 such that rack connector 22 connects to an opposing rail within the back of the rack system and component connector 30 attaches to an opposite side of the rear of a component. In this manner, the routing of cabling (not expressly shown) may be alternated on the back of the rack system. For example, a first component and cable management assembly could be installed such that the accompanying cabling is routed on the right side of the rear of a rack system. A second component and cable management could then be installed such that the accompanying cabling is routed on the left side of the rack system. In this manner, cabling routed in the rear of the rack system may be managed such that the volume of cabling on each side is equalized.

First hinge 20 of dual assembly 16 is rotatably connected to first arm 12. For the embodiment shown in FIG. 1A, first arm 12 is designed to be used with a component that has a height of 2U or greater. Portions of first arm 12 have been removed to create cut-outs or removed portions 60. In the present embodiment removed portions 60 of first arm 12 and second arm 14 each form a truss-type configuration. During operation, components stored within the rack system often generate a significant amount of heat. Air flow through the rack system dissipates the heat created by the components. Removed portions 60 allow air to flow through the rack assembly, especially between the rear portion of a component to the rear portion of the rack system. First arm 12 is also rotatably connected to second arm 14 via hinge assembly 15.

In the present embodiment, second hinge assembly 15 is preferably a dual hinge assembly connection. In an alternative embodiment, second hinge assembly 15 may be a single hinge connection (not expressly shown). In the present embodiment, second hinge assembly 15 provides a number of significant technical advantages. The introduction of second dual hinge assembly 15 provides a greater bending radius for cables that run along first arm 12 and second arm 14 when first arm 12 and second arm 14 are in a first, folded or collapsed position. This increased bonding radius allows the cable management assembly 10 to collapse or fold more easily. Second, including dual hinge 15 increases the extended or unfolded length of first arm 12 and second arm 14, allowing the associated component to slide forward further in the rack to service, remove, or install an associated component.

Second arm 14 is rotatably connected to second hinge assembly 15. In the present embodiment, second arm 14 includes removed portions 60, similar to those described for first arm 12 above. A component connector 30 is rotatably attached to second arm 14. In the present embodiment, component connector 30 is hingedly attached to second arm 14 via a spring-loaded hinge assembly 32. In an alternative embodiment, a conventional hinge assembly may connect second arm 14 to component connector 30. In the present embodiment, spring-loaded hinge assembly 32 acts to hold component connector 30 and second arm 14 in close association as the component is moved forward. As the component is moved forward, this preferably extends first arm 12 and hinge assemblies 15 and 16 before second arm 14 extends or unfolds. This allows cable management assembly 10 to smoothly unfold or extend when the component is pulled forward in the rack system for servicing.

A plurality of cable ties 40 and tabs 42 may be disposed along a portion of second arm 14. In the present embodiment, cable ties 40 and tabs 42 are preferably disposed to create two rows of cables (not expressly shown) within second arm 14. Providing cable ties 40 and tabs 42 in two rows allows the associated cables to be routed in two rows. This creates more simplified access to the cables and in an alternative embodiment, a single row of cable ties 40 and tabs 42 or a plurality of rows of cables and cable ties 40 and tabs 42 may be disposed along first arm 12 and second arm 14.

Detent arm 50 and detent arm housing 52 are also associated with second arm 14. In the present embodiment, detent arm 50 and detent arm housing 52 are preferably disposed on first arm 12 distal rack connector 24. Detent arm 50 and detent arm housing 52 are further described in FIG. 1C.

First arm 12 and second arm 14 may be constructed of materials suitable for a computing equipment environment such as metal or plastic materials. In the present embodiment, first arm 12 and second arm 14 are constructed of a stainless steel metal material. Further, first arm 12 and second arm 14 preferably have a channel configuration with an appropriate depth to allow cabling to be disposed within the channel interior. In an alternative embodiment, first arm 12 and second arm 14 may have a variety of different cross sectional geometries such as an L shaped geometry, a flat geometry, or a cup shaped geometry.

Figure 1B:
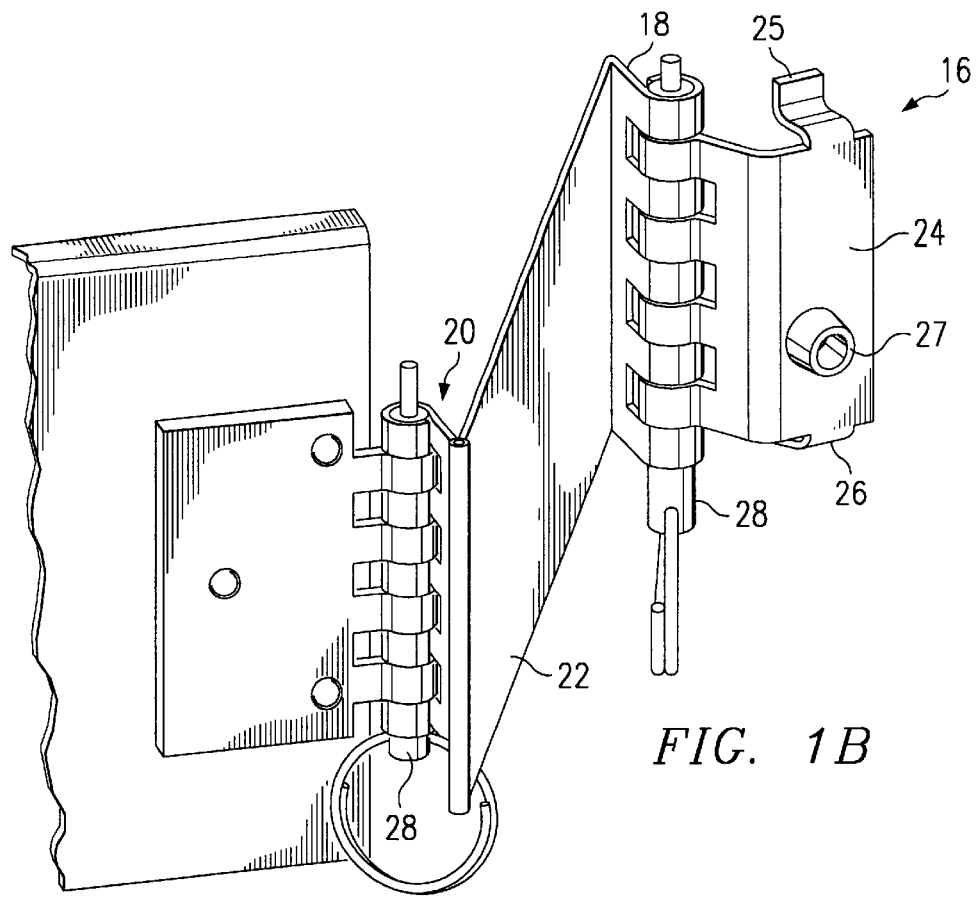
FIG. 1B is a schematic diagram with portions broken away showing one dual hinge and keyed rack connector.

Now referring to FIG. 1B which shows a schematic diagram of a Z-shaped dual hinge and a keyed rack connector. Dual hinge assembly 16 includes second hinge 18 and first hinge 20. First hinge 20 connects with first arm 12 via pin 28 and releaseably secured with a ring. Similarly, second hinge 18 connects with rack connector 24 via pin 28 releaseably secured by a ring. Rack connector 24 includes first keyed portion 25 and second keyed portion 26. In the present embodiment, first keyed portion 25 extends from a top portion of rack connector 24. First keyed portion 25 further extends perpendicular to rack connector 24 in an "L" shaped configuration. Second keyed portion 26 extends from a lower portion of rack connector 24 and further extends in a direction perpendicular to rack connector 24 in an "L" shaped configuration. Threaded hole 27 extends from rack connector 24 operable to interface with a threaded fastener such as a bolt or screw to secure rack connector 24 to a rack system. In a preferred embodiment, the thread connector comprises a thumb screw (not expressly shown) operable to tool-lessly secure rack connector 24 to a rail within a rack system. In a preferred embodiment, a threaded fastener may secure the threaded fastener to a case nut associated with a rack system rail.

Figure 1C:
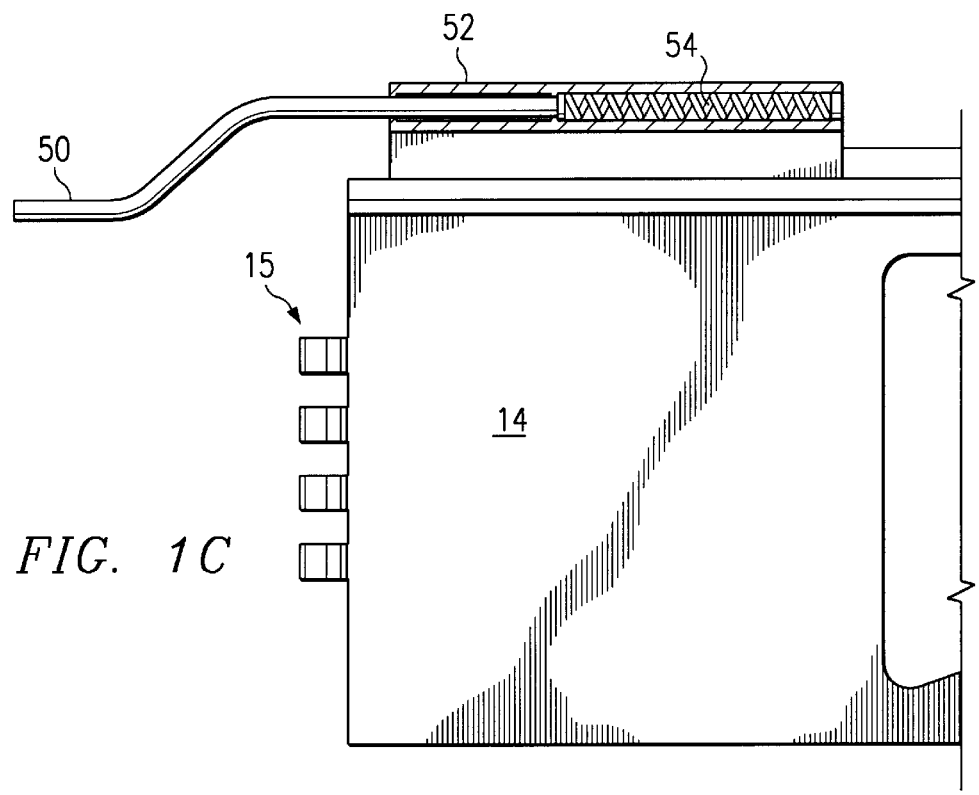
FIG. 1C is a schematic diagram with portions broken away showing a detent assembly.

FIG. 1C is a schematic diagram of a detent assembly. Second arm 14 includes a portion of hinge assembly 15. Detent arm housing 52 is preferably secured to an upper portion of second arm 14. Detent arm 50 is preferably an extended rod associated with detent arm housing 52 and detent spring 54 such that a portion of detent arm 50 is contained within detent arm housing 52. Another portion of detent arm 50 protrudes from detent arm housing 52.

Detent arm 50 is preferably moveable between a first position, where detent arm 50 protrudes from detent arm housing 52 and a second position where detent arm 50 is inserted into detent arm housing 52. In this second position detent spring 54 is compressed by detent arm 50.

When detent arm 50 is in the first position, extended from housing 52, detent arm 50 extends operable to contact a rail or interior portion of the rack as the cable management assembly 10 is retracted or placed in a first, folded position. The detent arm 50, detent housing 52, and detent spring 54 are preferably operable to retain cable management assembly 10 within the rack system and allow a technician selective access to the rear of components stored in a rack system. By positioning detent arm 50 in the second position, cable management arm 50 may then swing to the rear of the rack system, allowing access to the rear of an associated component.

In operation, rack connector 24 is installed within a computer rack system as shown in FIG. 3. In the present embodiment, rack connector 24 is preferably operable to interface with interior rails 205 (as shown in FIG. 3) within a rack system. In the embodiment shown in FIGS. 1A, 1B, and 1C, rack connector 24 may be connected with a standardized interface within rack system interior rail 205. Specifically, the first keyed portion 25 and second keyed portion 26, as shown in FIG. 1B, preferably engage a standardized interface within rack system rail 205. Also, a threaded fastener (not expressly shown) may be used to connect and secure rack connector 24 to rail 205. In a preferred embodiment, a thumb screw may be used to secure rack connector 24 to rack system rail 205, supporting a tool-less connection. That is, rack connector 24 may be secured to the rack system without the use of any tools.

After connecting the rack connector 24 to rack system rail 205, component connector 30 may be secured to a component which is to be stored within the rack system. The component connector may be secured to the computer component using a suitable fastener such as a screw, bolt, preferably a fastener which does not require a separate tool for installation such as a thumb screw.

In operation, securing component connector 24 to a component may include extending cable management assembly 10 forward within the rack system to allow easier access to the component connector 30 and to the associated component. After securing component connector 30 to the associated component, cabling associated with the component may be selectively secured within interior portions of first arm 12 and second arm 14 using cable ties 40 and tabs 42. This may include looping cable ties 40 around the desired cables, threading cable ties 40 through tabs 42, cinching cable ties 40 and securing cable ties 40. In a preferred embodiment, cable ties 40 may be made of a Velcro material, more specifically cable ties 40 may be of a double sided Velcro material. After the cables are secured to first arm 12 and second arm 14, the component may be pushed into the rack system for convenient use and storage. Accordingly, pushing the associated component into the rack system pushes cable management arm 10 in the first, folded position.

From time to time, when a component requires maintenance, servicing, or disassembly, cable management assembly 10 facilitates access to the attached component. One method of accessing portions of the component is to pull the component forward. When the component is pulled forward, the cable management assembly 10 extends or unfolds such that first arm 12 and second arm 14 extend from their first, folded position in the back of the rack system to a second, extended position allowing the component to move forward and remain attached to its cabling.

Now referring to FIG. 2A, a schematic diagram showing a cable management assembly 100 according to the present disclosure is depicted. Cable management assembly 100 includes first arm 12 hingedly connected to second arm 114. First dual hinge assembly 116 rotatably connect to first arm 112. First arm 112 rotatably connects to second arm 114 by second hinge connection 115. Second arm 114 rotatably connects to component connector 130.

First hinge assembly 116 is further described in FIG. 2B and component connector 130 is further described in FIG. 2C. In the present embodiment, first arm 12 and second arm 114 depict a 1U cable management arm. Accordingly, first arm 112 and second arm 114 are designed to function within a 1U vertical portion of a computer rack system. First arm 112 and second arm 114 further have portions removed 160 to facilitate the flow of air through a computer rack. Removed portions 160 preferably form a truss pattern. Cable ties 140 and tabs 142 are preferably disposed along first arm 112 and second arm 114 and are operable to secure cables (not expressly shown) running between the attached component and the rack connector 124 and beyond. Second arm 114 further includes detent housing 152 and detent arm 150.

Detent arm 150 and detent housing 152 cooperate to allow detent arm 150 to selectively protrude from detent housing 15 and second arm 114 such that cable management assembly 100 may not swing past the back of the rack system. Detent arm 150 may be selectively recessed within detent housing 152 such that cable management assembly may selectively swing out the back of the rack system, allowing access to the rear of the rack system.

FIG. 2B is a schematic diagram of a dual hinge assembly according to the present invention. Dual hinge assembly 116 includes first hinge 120 and second hinge 118 connected by hinge arm 122. Rack connector 124 is further rotatably connected to second hinge 118.

Rack connector 124 includes first keyed portion 125, second keyed portion 126 and third keyed portion 127 as well as threaded hole 128. First keyed portion 125 and second keyed portion 126 extend from within rack connector 124. First keyed portion 125 extends laterally from a side of rack connector 124. Second keyed portion 126 extends vertically from the bottom of an open portion of rack connector 124 and further forms an L-shape that extends perpendicular to rack connector 124. Third keyed portion 127 extends from a bottom portion of rack connector 124 and further forms an L-shape extending perpendicular from rack connector 124. Threaded hole 128 is preferably formed within rack connector 124 and is operable for securing rack connector 124 to an interface portion of a rack system rail 205.

In an alternative embodiment, the keyed interface on rack connector 124 may include keyed portions operable to align rack connector 124 with a rack system rail. The keyed portions may include keyed corner portion that align with a corner within a standard rail interface. Alternatively, the keyed portion may include a keyed interface operable to hook onto a standard rail interface.

FIG. 2C is a schematic diagram showing a component connector hingedly attached to a second arm. Component connector 130 is hingedly attached to second arm 114 via spring-loaded hinge 132. Spring-loaded hinge 132 includes spring 138 operable to retain component connector 130 adjacent to second arm 114. Component connector 130 includes pin housing 136 and spring-loaded pin 134. Component connector 130 is preferably formed to tool-lessly interface with a rear portion of a component stored within a rack system. More specifically, spring-loaded pin 134 and tab 135 are preferably formed to tool-lessly secure component connector 120 to a rear portion of an associated component stored within a rack system.

In operation, tab 135 is aligned with a portion of a computer component. Spring-loaded pin 134 may be selectively recessed within pin housing 136 and aligned with the portion of the component. Spring-loaded pin 134 may be selectively released to interface with a recessed portion of the component, tool-lessly and releaseably securing component connector 134 to the component.

FIG. 3 is a schematic diagram of a computer system having a number of computer components stored within a rack system. the computer components are shown in various positions to describe features of the present disclosure. Rack system 200 includes rack front 202 and rack rear 204. Rack 200 includes four vertical supports or rails 205 as well as a top and bottom. Support slides 208 are releaseably secured to rails 205 such that components 206 secured to support slides 208 may selectively be retained within rack 200 or be extended from rack 200. When computer components 206 are placed in a retracted position within rack 200, cable management arm 210 is in a first, retracted or folded position 212. Accordingly, the cables secured to cable management arm 210 are also folded behind component 206. When the component is extended from rack 202 the cable management arm is in a second, extended or unfolded position 214. Accordingly, cables associated with cable management arm 210 also preferably extend and unfold.

When component 206 is in the first, retracted position 212 access may also be available through the rack rear 204. In this instance, cable management arm 210 may swing rearward in the direction shown by arrow 216, allowing for access to the rear section of component 206. In a preferred embodiment, a detent assembly including a detent arm and detent housing as shown in FIG. 1C may be used to selectively retain cable management arm 210 or selectively swing cable management arm 210 rearward 216.

Although the disclosed embodiments have been described in detail, it should be understood that various changes, substitutions and alterations can be made to the embodiments without departing from their spirit and scope.

What is claimed is:

1. A rack system for releaseably mounting a computer system component therein comprising:
    a rack having a standard interface;
    a cable management assembly operable to secure a plurality of cables, to an attached component
    a rack connector formed to releaseably connect the cable management assembly to the standard interface;
    a first dual hinge assembly connected to the rack connector;
    a first arm connected to the dual hinge assembly distal the rack connector;
    a second arm hingedly connected to the first arm distal the dual hinge assembly;
    a component connector hingedly connected to the second arm distal the first arm; and
    the component connector operable to attach a computer system component to the cable management assembly.

2. The rack system of claim 1 wherein the rack connector further comprises:
    a keyed interface for connecting with the standard interface; and
    a threaded hole for releaseably securing the rack connector to the standard interface with a fastener.

3. The rack system of claim 2 wherein the fastener further comprises a thumbscrew.

4. The rack system of claim 1 wherein the dual hinge assembly further comprises a Z-shaped configuration operable to vertically offset the rack connector from the first arm.

5. The rack system of claim 1 further comprising the rack connector and dual hinge assembly formed to be selectively reversible.

6. The rack system of claim 1 wherein the component connector further comprises a spring-loaded hinge assembly operable to releaseably engage the component housed within the rack system.

7. The rack system of claim 1 further comprising:
the first arm having removed portions to allow air flow through the first arm; and
the second arm having removed portions to allow air flow through the second arm.

8. The rack system of claim 1 further comprising a plurality of cable ties attached to the first arm and the second arm to releaseably secure at least one cable thereto.

9. The rack system of claim 8 further comprising tabs associated with the cable ties operable selectively tighten the cable ties.

10. The rack system of claim 1 further comprising:
a detent assembly associated with the second arm operable to selectively retain the cable management assembly; and
the detent assembly further operable to selectively allow the cable management assembly to pivot away from the rack.

11. The rack system of claim 10 further comprising:
a spring-loaded detent arm selectively movable between a first position and a second position;
the first position operable to retain the cable management assembly; and
the second position operable to allow the cable management assembly to pivot away from the rack.

12. A cable management assembly comprising:
a first hinge assembly having a dual hinge connected to a rack connector;
a first arm connected to the first hinge assembly;
a second arm hingedly connected to the first arm; and
a component connector hingedly connected to the second arm.

13. The cable management assembly of claim 12 wherein the rack connector further comprises a thumb screw operable to attach to a standard rack interface without the use of a tool.

14. The cable management assembly of claim 12 further comprising the first arm and the second arm hingedly connected by a second hinge assembly having a dual hinge.

15. The cable management assembly of claim 12 further comprising a detent assembly associated with the second arm operable to selectively retain the cable management within a standard rack.

16. The cable management assembly of claim 12 further comprising a plurality of cable ties disposed along the first arm and the second arm.

17. A method for managing cabling with a rack comprising:
securing a rack connector portion of a cable management assembly to a standard rack interface within a rack, the rack connector attached to a dual hinge;
securing a component connector to a component housed within the rack; and
securing component cables within tabs disposed along the first arm and the second arm.

18. The method of claim 17 further comprising:
selectively retaining the first arm and second arm within the rack; and
selectively releasing the first arm and second arm to pivot rearward from the rack.

19. The method of claim 17 further comprising tool-lessly securing the rack connector portion of the cable management arm to the standard rack interface.

20. The method of claim 17 further comprising:
selectively moving the component forward thereby extending the cable management assembly; and
selectively moving the component rearward thereby folding the cable management assembly.

* * * * *